US012765357B2

(12) United States Patent
Zhao et al.

(10) Patent No.: US 12,765,357 B2
(45) Date of Patent: Oct. 13, 2026

(54) SEMICONDUCTOR DEVICE BACKSIDE POWER DISTRIBUTION NETWORK STRUCTURE AND METHOD OF MAKING

(71) Applicant: Avago Technologies International Sales Pte. Limited, Singapore (SG)

(72) Inventors: Sam Zhao, Irvine, CA (US); Xiaoming Li, Newport Beach, CA (US); Qing Liu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 405 days.

(21) Appl. No.: 18/496,490

(22) Filed: Oct. 27, 2023

(65) Prior Publication Data

US 2025/0140693 A1 May 1, 2025

(51) Int. Cl.
*H01L 23/528* (2006.01)
*H01L 23/14* (2006.01)
(Continued)

(52) U.S. Cl.
CPC ......... *H10W 20/427* (2026.01); *H10W 20/20* (2026.01); *H10W 70/698* (2026.01)

(58) Field of Classification Search
CPC ... H10W 20/427; H10W 20/41; H10W 20/20; H10W 70/698; H10W 70/611; H10W 70/09; H10W 20/023; H10W 20/00; H10W 70/68; H10W 70/40; H10W 72/20; H10W 72/50; H10W 72/011; H10W 99/00; H10D 88/00; H10D 88/01; H10D 88/101; H01L 21/50; H01L 21/4882; H01L 21/768; H01L 23/5283; H01L 23/147; H01L 23/481;
(Continued)

(56) References Cited

U.S. PATENT DOCUMENTS

| | | | |
|---|---|---|---|
| 11,257,764 | B2 | 2/2022 | Hiblot et al. |
| 11,444,068 | B2 | 9/2022 | Song et al. |

(Continued)

FOREIGN PATENT DOCUMENTS

| | | | |
|---|---|---|---|
| EP | 3324436 | A1 | 5/2018 |
| EP | 4152381 | A1 | 3/2023 |
| EP | 4227994 | A1 | 8/2023 |

OTHER PUBLICATIONS

P. McLellan, “IEDM: Backside Power Delivery,” Mar. 9, 2023, 10 pages.

(Continued)

*Primary Examiner* — Nikolay K Yushin
(74) *Attorney, Agent, or Firm* — Quarles & Brady LLP

(57) ABSTRACT

Novel tools and techniques are provided for implementing a semiconductor package or a chip package, and more particularly methods, systems, and apparatuses are provided for implementing a semiconductor package or a chip package including a backside power distribution network. In various embodiments, an apparatus includes a first substrate comprising a device configured to receive a voltage and a first side located on a front side of the first substrate and a second side located on a back side of the first substrate, a second substrate, the second substrate configured to support the first substrate, and a power distribution network located at an interface between the second side of the first substrate and the second substrate.

19 Claims, 10 Drawing Sheets

(51) Int. Cl.

| | |
|---|---|
| ***H01L 23/48*** | (2006.01) |
| ***H10W 20/20*** | (2026.01) |
| ***H10W 20/41*** | (2026.01) |
| ***H10W 70/698*** | (2026.01) |

(58) Field of Classification Search

CPC ........... H01L 27/0207; H01L 27/02886; H01L 27/0886

See application file for complete search history.

(56) References Cited

U.S. PATENT DOCUMENTS

| | | | | |
|---|---|---|---|---|
| 11,557,583 | B2 | 1/2023 | Chen et al. | |
| 11,881,455 | B2 * | 1/2024 | Park | H01L 21/76898 |
| 2019/0259702 | A1 | 8/2019 | Jain | |
| 2020/0266169 | A1 | 8/2020 | Kang et al. | |
| 2021/0118805 | A1 | 4/2021 | Sio et al. | |
| 2022/0130760 | A1 | 4/2022 | Wu et al. | |
| 2022/0165721 | A1 | 5/2022 | Lee et al. | |
| 2022/0181263 | A1 | 6/2022 | Liebmann et al. | |
| 2022/0188496 | A1 | 6/2022 | Edathil et al. | |
| 2022/0293634 | A1 | 9/2022 | Okamoto et al. | |
| 2022/0384345 | A1 * | 12/2022 | Park | H01L 21/76898 |
| 2023/0207553 | A1 | 6/2023 | Xie et al. | |

OTHER PUBLICATIONS

P. McLellan, "Backside Power Delivery," https://www.imec-int.com/en/articles/how-power-chips-backside, last accessed on Oct. 24, 2023, 21 pages.

G. Sisto et al., "IR-Drop Analysis of Hybrid Bonded 3D-ICs with Backside Power Delivery and μ-& n-TSVs," Jul. 1, 2021, https://www.researchgate.net/publication/353435458_IR-Drop_Analysis_of_Hybrid_Bonded_3D-ICs_with_Backside_Power_Delivery_and_-_n-TSVsm, last accessed Oct. 24, 2023, 7 pages.

O. Hossen et al., "Power Delivery Network (PDN) Modeling for Backside-PDN Configurations with Buried Power Rails and μTSVs," Jun. 22, 2023, 7 pages.

R. Chen, et al., "Invited Paper: Opportunities of Chip Power Integrity and Performance Improvement through Wafer Backside (BS) Connection," Nov. 4, 2022, 6 pages.

Flaherty, "Delivering power from the back of a chip," Jun. 14, 2021, 3 pages.

A. Shilov, "Intel Details PowerVia Backside Power Delivery Technology," Jun. 6, 2023, 19 pages.

European Patent Office, Extended Search Report, Application No. 24199767.5, Mar. 5, 2025, 10 pages.

* cited by examiner

SEMICONDUCTOR DEVICE BACKSIDE POWER DISTRIBUTION NETWORK STRUCTURE AND METHOD OF MAKING

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for implementing a semiconductor package or a chip package.

BACKGROUND

In existing semiconductor devices, a power distribution network (e.g., a frontside power distribution network) is often located on a front side of a substrate on the top metal layers. Power is then transmitted to front end of line active devices located under the metal layers from the power distribution network located on the top metal layers. However, this power transmission path to the front end of line active devices has several issues. The top metal layers that electrical current must travel through before reaching the front end of line active devices cause significant voltage drop, also known as IR drop. As the IR drop increases, a significant amount of power is wasted along the current path through the top metal layers. Additionally, power integrity is difficult to maintain with the long transmission path through the top metal layers. Further, the power rails and/or power lines must be placed alongside signal lines within the top metal layers. Placing the power rails and/or power lines alongside signal lines limits the size that the semiconductor can be reduced because cell size reduction is limited by the size of power rail and/or power lines within each cell. In some cases, having the power lines alongside the signal lines further causes interference within the signal lines.

Hence, there is a need for more robust and scalable solutions for implementing semiconductor packages and chip packages. Thus, methods, systems, and apparatuses are provided for implementing semiconductor packages or chip packages including a backside power distribution network in a semiconductor device.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1:
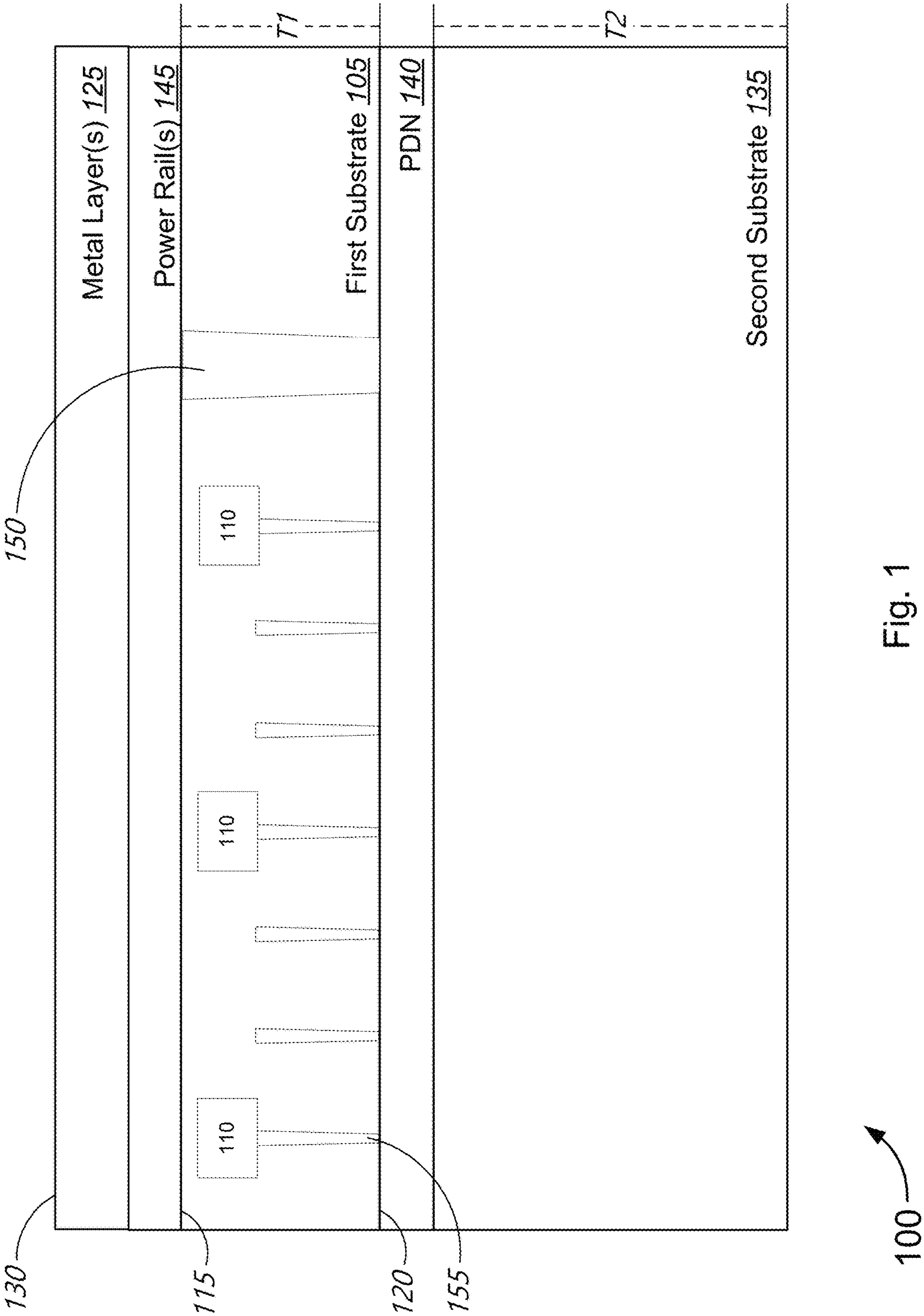
FIG. 1 is a schematic cross-sectional view of a semiconductor device with a backside power distribution network, in accordance with various embodiments.

Various embodiments provide tools and techniques for implementing semiconductor packages or chip packages including a backside power distribution network are described herein.

In a first aspect, an apparatus comprises a first substrate comprising a first device configured to receive a voltage, a first side disposed on a front of the first substrate, and a second side disposed on a back of the first substrate, a second substrate, the second substrate configured to support the first substrate, and a power distribution network disposed at an interface between the second side of the first substrate and the second substrate.

In some embodiments, the first substrate comprises monocrystalline silicon and the second substrate comprises monocrystalline silicon, polycrystalline silicon, silicon carbide, glass, sapphire, or gallium arsenide.

In some cases, the first device configured to receive the voltage comprises a transistor.

In various instances, the power distribution network directly couples to the second side of the first substrate and the second substrate.

In various embodiments, the first substrate further comprises a first connector coupled to a power source and to the power distribution network and a second connector coupled to the power distribution network and the first device of the first substrate. A ratio of a first diameter of the first connector to a second diameter of the second connector can be between about 3:1 and 20:1. In some instances, at least one of the first connector or the second connector comprises a via or a trench.

In some cases, a ratio of a first thickness of the first substrate to a second thickness of the second substrate is between about 1:200 and 1:10.

In some instances, the apparatus further includes a third substrate between the power distribution network and the first substrate and the third substrate couples the power distribution network to the first substrate. The third substrate can further include a first connector coupled to a power source and to the power distribution network and a second connector coupled to the power distribution network and the first device of the first substrate.

In various cases, the second substrate further comprises a second device configured to provide non-volatile memory. The first substrate can further include a circuit towards the second side of the first substrate. The circuit can be configured to control a current.

In another aspect, a method of manufacturing a backside power distribution network of a semiconductor device comprises forming at least one of a first substrate comprising a device configured to receive a voltage or a second substrate, wherein the second substrate is configured to support the first substrate and forming a power distribution network configured to be disposed at an interface between the first substrate and the second substrate.

In some cases, forming the power distribution network disposed at the interface between the first substrate and the second substrate comprises forming the power distribution network on a back side of the first substrate. Once the power distribution network is formed on the first substrate, the method further comprises bonding the first substrate to the second substrate.

In various embodiments, forming the power distribution network disposed at an interface between the first substrate and the second substrate comprises forming the power distribution network on the second substrate. Once the power distribution network is formed on the second substrate, the method further comprises bonding the first substrate to the second substrate.

In some instances, forming the power distribution network disposed at an interface between the first substrate and the second substrate comprises forming a third substrate and forming the power distribution network on the third substrate. The third substrate further comprises a connector configured to couple the device of the first substrate with the power distribution network. Once the power distribution network is formed on the third substrate, the method further comprises bonding the first substrate to the third substrate and the second substrate to the third substrate. The power distribution network can be between the second substrate and the third substrate.

In yet another aspect, a semiconductor device includes a first substrate comprising a device configured to receive a voltage; a metal layer coupled to a first side of the first substrate; a second substrate coupled to a second side of the first substrate opposite the metal layer and the first side, the second substrate configured to support the first substrate; and a power distribution network disposed between the second side of the first substrate and the second substrate.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected," "coupled," or "attached" to another element, it is to be understood that the elements can be directly connected to the other element, or have intervening elements present between the elements. In contrast, when an element is referred to as being "directly connected," "directly coupled," or "directly attached" to another element, it should be understood that no intervening elements are present in the "direct" connection between the elements. However, the existence of a direct connection does not exclude other connections, in which intervening elements may be present.

When an element is referred to herein as being "disposed" or "located" in some manner relative to another element (e.g., disposed on, disposed between, disposed under, disposed adjacent to, or disposed in some other relative manner), it is to be understood that the elements can be directly disposed or located relative to the other element (e.g., disposed directly on another element), or have intervening elements present between the elements. In contrast, when an element is referred to as being "disposed directly" or "located directly" relative to another element, it should be understood that no intervening elements are present in the "direct" example. However, the existence of a direct disposition does not exclude other examples in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." The term "substantially" or "about" used herein refers to variations from the reference value or ratio of ±10% or less (e.g., ±10%, ±5%, etc.), inclusive of the endpoints of the range.

In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase “at least one of” preceding a series of items, with the term “and” or “or” to separate any of the items, modifies the list as a whole, rather than each member of the list (i.e., each item). The phrase “at least one of” does not require selection of at least one of each item listed; rather, the phrase allows a meaning that includes at least one of any one of the items, and/or at least one of any combination of the items. By way of example, the phrases “at least one of A, B, and C” or “at least one of A, B, or C” each refer to only A, only B, or only C; and/or any combination of A, B, and C. In instances where it is intended that a selection be of “at least one of each of A, B, and C,” or alternatively, “at least one of A, at least one of B, and at least one of C,” it is expressly described as such.

In existing semiconductor or chip packages, a power distribution network (“PDN”) to power one or more front end of line (“FEOL”) active devices is typically located on a frontside of the semiconductor substrate on the top metal layers. However, this power transmission path to the front end of line active devices has several issues. The top metal layers that electrical current must travel through before reaching the FEOL active devices can cause significant voltage drop, also known as IR drop. As the IR drop increases, a significant amount of power is wasted along the current path through the top metal layers. Further, as semiconductor packages become more complex, the power rails and/or power lines compete for space and limit the size that the semiconductor device can be reduced because cell size reduction can be limited by the size of power rail and/or power lines within each cell.

The subject technology comprises a semiconductor or chip device (e.g., integrated circuit (IC), chip, or other semiconductor device or module) that provides a backside power distribution network (“PDN”) at an interface of a first substrate and a second substrate. By implementing a backside PDN at an interface of a first substrate and a second substrate, the power transmission path to the FEOL active devices can be shorter resulting in a decrease in IR drop. Additionally, the size that the semiconductor device can be reduced because the power rails do not need to be as big as a PDN located on a frontside of a semiconductor device.

FIGS. 1-4 and 6 are schematic cross-sectional views of different embodiments of a semiconductor device 100, in accordance with various embodiments. It should be noted that the various components of semiconductor device 100 are schematically illustrated in FIGS. 1-4 and 6, and that modifications to the various components, orientations, and other arrangements of semiconductor device 100 may be possible and in accordance with the various embodiments. In addition, only some components and/or layers of the semiconductor device 100 are shown in FIGS. 1-4 and 6, there could be more or less components and/or layers, in accordance with various embodiments and semiconductor device 100 is not intended to be limited to only the components and/or layers shown. In addition, although FIGS. 1-4 and 6 are described as separate embodiments for ease of description, a person of ordinary skill would understand that various modifications to each embodiment may be applied to other embodiments.

In various embodiments, the semiconductor device 100 includes a first substrate (or wafer) 105. The first substrate 105 comprises a supporting material (e.g., monocrystalline silicon, and/or any other semiconductor material or combination of materials) upon which or within which elements or components (e.g., connectors, passive devices, active devices, or the like) of semiconductor device 100 are fabricated or coupled. In some cases, the first substrate 105 is monocrystalline silicon. In various instances, the first substrate 105 can be doped with a p-type dopant (e.g., boron or the like) and/or an n-type dopant (e.g., phosphorus, arsenic, or the like). In various cases, the first substrate 105 can be formed from one or more layers. The one or more layers can include, without limitation, one or more dielectric layers, one or more device layers, one or more conducting layers, one or more insulating layers, one or more redistribution layers, and/or the like.

In some cases, the first substrate 105 can include one or more passive or active devices 110. The one or more passive devices can be one or more circuit components (e.g., conductors, resistors, capacitors, inductors, etc.) which can transmit, absorb, and/or dissipate power. The one or more active devices can be one or more circuit components (e.g., transistors, or the like) that can control the flow of power. In various instances, the first substrate 105 can be an active substrate (e.g., a substrate having one or more active devices such as transistors).

The one or more passive or active devices 110 can include, but are not limited to, one or more capacitors, one or more inductors, one or more transistors, one or more field programmable gate arrays (FPGA), one or more memory devices, one or more microelectromechanical systems (MEMS), or the like. The passive or active devices 110 can be arranged to be complementary metal-oxide-semiconductor (“CMOS”) circuits, radio frequency (“RF”) circuits, logic circuits, peripheral circuits, or other types of circuits, and/or the like. In some embodiments, passive or active devices 110 can include fin field-effect transistors (finFETs) with gate terminals and source/drain terminals, metal-oxide semiconductor field effect transistors (MOSFETs), or planar transistor devices and/or the like.

In various cases, the first substrate 105 comprises a first side 115 (e.g., a front side) and a second side 120 (e.g., a back side) opposite to the first side 115. In various instances, the first side 115 is a top portion or a front side of the first substrate where front end of line (FEOL) fabrication ends while the second side 120 is a bottom portion or back side of the first substrate 105. The FEOL fabrication is the first portion of integrated circuit fabrication where the one or more passive or active devices 110 are patterned in the first substrate 105 of the semiconductor device 100.

In some cases, the first side 115 of the first substrate 105 can be coupled to or include one or more metal layers 125. The one or more metal layers 125 can be formed using one or more back end of line (“BEOL”) processes. The BEOL is a second portion of integrated circuit fabrication where one or more wirings or metal layers are deposited to form one or more interconnections between the passive or active devices 110 and/or between the passive or active devices 110 and a circuit board (e.g., printed circuit board) of the semiconductor device 100. The one or more metal layers 125 can include one or more signal lines coupled to the one or more passive or active devices 110. A top layer 130 or a connector on a top layer 130 of the one or more metal layers 125 can be configured to couple to a circuit board, a printed circuit board (“PCB”), or the like.

In some cases, the semiconductor device 100 further includes a second substrate or wafer 135. In various cases, the second substrate 135 can be formed from one or more layers. The one or more layers can include, without limitation, one or more dielectric layers, one or more device layers, one or more conducting layers, one or more insulating layers, one or more redistribution layers, and/or the like.

The second substrate 135 can be a carrier substrate or a support substrate configured to support the first substrate 105. As an example, the term "carrier" or "support" refers to a material or layer that holds, supports, protects, and/or provides structural and mechanical rigidity to the first substrate 105 within a packaging. There are different types of carrier or support substrates depending on the packaging technology and application. For example, a carrier according to embodiments of the present disclosure may include one or more materials such as monocrystalline silicon, polycrystalline silicon, gallium arsenide, sapphire, silicon carbide, glass material, organic material, ceramic material, and/or other material configured to carry or support the first substrate 105. In some cases, the second substrate 135 is polycrystalline silicon. Depending on the particular application, carriers or support substrates can possess attributes such as heat dissipation capabilities, or other features. For example, second substrate 135 can be engineered to provide structural and mechanical rigidity and support for the first substrate 105 within a packaging. In some cases, the first substrate 105 can be an "active" substrate (e.g., a substrate comprising one or more active devices 110) while second substrate 135 can be a support substrate supporting or carrying first substrate 105.

In various cases, a first thickness T1 of the first substrate 105 can be about 1.5 μm to about 50 μm while a second thickness T2 of the second substrate can be about 100 μm to about 800 μm. Preferably, a ratio of a first thickness T1 of the first substrate 105 to a second thickness T2 of the second substrate 135 is between about 1:200 and 1:10.

The semiconductor device 100 can further include a power distribution network ("PDN") 140 located between the second side 120 of the first substrate 105 and the second substrate 135. In some cases, the PDN 140 is a backside PDN. In other words, the PDN 140 is located on the second side 120 or back side of the first substrate 105 opposite to the first side 115 of the first substrate 105 and opposite to the one or more metal layers 125. In some cases, the PDN 140 can be fabricated with the first substrate 105. Alternatively, in other cases, the PDN 140 can be fabricated with the second substrate 135. As described below with respect to FIGS. 8-10.

In some cases, the PDN 140 is at an interface between the first substrate 105 and the second substrate 135. In various cases, the PDN 140 can directly contact the first substrate 105 and/or the second substrate 135.

The PDN 140 is configured to deliver power to one or more passive or active devices 110 of the first substrate 105. The PDN 140 can be configured to provide power in one or more voltage domains. For example, the PDN 140 can be configured to provide a positive power supply voltage (e.g., VDD) and/or a negative power supply voltage (e.g., VSS, ground (GND)=0V) to the one or more passive or active devices 110 of the first substrate 105. The PDN 140 can comprise one or more layers (e.g., one or more metal layers, conductive layers, insulating layers, redistribution layers, or other layers). In some cases, the PDN 140 can comprise one or more components or connectors configured to distribute power to the one or more passive or active devices 110. The one or more components can include, without limitation, one or more power wires, one or more redistribution layers (e.g., to reroute connections to desired locations), one or more connectors or interconnects, one or more power rails, and/or the like.

The one or more connectors can include, without limitation, one or more conductive pads, conductive traces, conductive vias, conductive micro bumps, conductive solder balls, conductive posts or pillars, and/or other suitable connectors or interconnects. The one or more vias may extend completely through the PDN 140 (e.g., a "through" via), may extend through the PDN 140 from one outer surface (e.g., a "blind" via), or may extend through a portion of the PDN 140 and be completely hidden from external view (e.g., a "buried" via), and/or the like. The conductive material of the connectors might include a metal such as copper, tungsten, aluminum, gold, silver, tin, nickel, lead, or a combination of metals/alloys, or may be formed of other electrically conductive material or combination of electrically conductive materials. The one or more connectors can be configured to form an electrical connection for power to travel to or from PDN 140.

In some cases, the semiconductor device 100 further comprises one or more power rails 145. The one or more power rails 145 can comprise one or more front end of line ("FEOL") or back end of line ("BEOL") power rails 145. In other words, the power rails 145 can be located at an interface between a first side 115 of the first substrate 105 and a bottom portion of the one or more metal layers 125, located within or on top of the one or more metal layers 125, and/or located within first substrate 105. Although only one power rail 145 is shown in FIG. 1, there could be more power rails 145.

The power rail 145 can be configured to receive a voltage (e.g., VDD or VSS) or power from a power source (e.g., a circuit board, a printed circuit board, or another power source configured to provide power) located above the one or more metal layers 125. The power rail 145 can then transmit the voltage or power to one or more first connectors or global power posts ("GPPs") 150. The one or more global power posts 150 might be configured in a global power post array. The one or more GPPs 150 can include, without limitation, one or more vias, one or more deep metal trenches, and/or one or more other connectors or interconnects configured to connect the power rail 145 to the PDN 140 or to one or more components configured to distribute power through the PDN 140. The one or more vias, one or more deep metal trenches and/or one or more other interconnections or connectors can be formed from a metal such as copper, tungsten, titanium, aluminum, gold, silver, tin, nickel, lead, or a combination of metals/alloys, or may be formed of other electrically conductive material or combination of electrically conductive materials. The one or more GPPs 150 can extend completely through the first substrate 105 and/or metal layers 125 (e.g., a "through" via), may extend through the first substrate 105 from one outer surface (e.g., a "blind" via), or may extend through a portion of the first substrate 105 and be completely hidden from external view (e.g., a "buried" via), and/or the like.

In some cases, the first substrate 105 of the semiconductor device 100 includes one or more second connectors or second power posts 155. The one or more second power posts 155 might be configured in a power post array. The one or more second power posts 155 can include, without limitation, one or more vias, deep metal trenches, and/or one or more other interconnections or connectors configured to connect the PDN 140 and/or one or more components of the PDN 140 to the one or more passive or active devices 110. The one or more vias, one or more deep metal trenches and/or one or more other interconnections or connectors can be formed from a metal such as copper, tungsten, titanium, aluminum, gold, silver, tin, nickel, lead, or a combination of metals/alloys, or may be formed of other electrically conductive material or combination of electrically conductive materials. The one or more second power posts 155 may extend completely through the first substrate 105 (e.g., a "through" via), may extend through the first substrate 105 from one outer surface (e.g., a "blind" via), or may extend through a portion of the first substrate 105 and be completely hidden from external view (e.g., a "buried" via), and/or the like.

In various cases, a diameter of the GPPs 150 might be larger than a diameter of the second power posts 155 in order to more effectively transmit power or current. In a non-limiting example, a diameter of the GPPs 150 can be about 30 nm to about 20 μm while a diameter of the second power posts 155 can be about 50 nm to about 5 μm. Preferably, a ratio of a first diameter of the GPP 150 to a second diameter of the second power posts 155 is between about 3:1 and 20:1.

In some instances, power or a voltage can be transmitted through the semiconductor device 100 from a power source to the power rail 145 to GPP 150 to the PDN 140 to the second power posts 155 to the one or more active devices 110.

Figure 2:
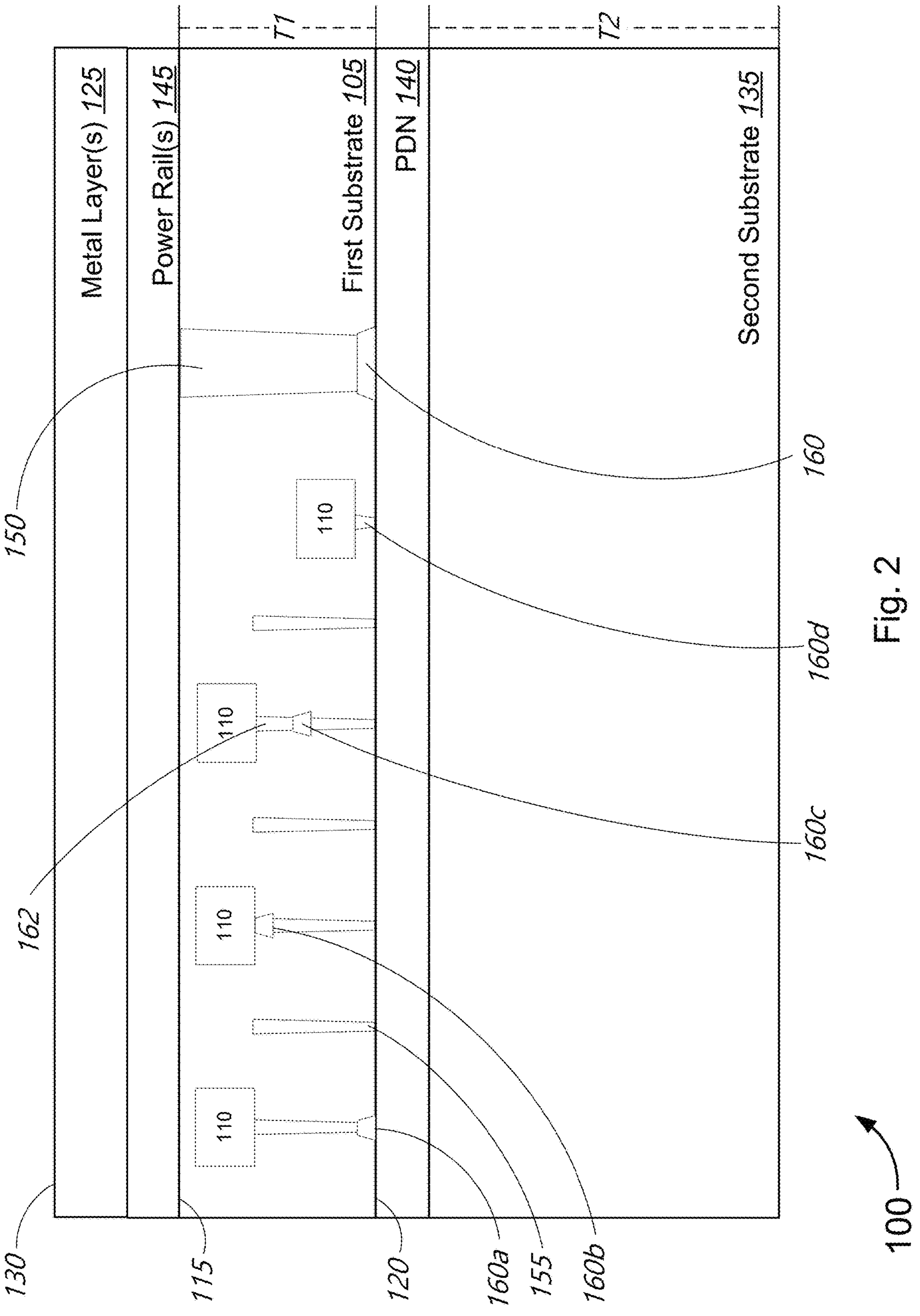
FIG. 2 is a schematic cross-sectional view of a semiconductor device with a backside power distribution network, in accordance with various embodiments.

In another embodiment, as shown in FIG. 2, the first substrate 105 can include one or more buried power connectors 160. The one or more buried power connectors 160 can be coupled to the one or more GPPs 150, to the PDN 140, to the one or more second power posts 155, to one or more connectors of the first substrate 105, to the one or more passive or active devices 110, or the like. The one or more buried power connectors 160 can include, without limitation, one or more vias, one or more trenches (e.g., one or more insulated trenches), and/or one or more other interconnections capable of transmitting a voltage to one or more passive or active devices 110 from the PDN 140, or the like. The one or more buried power connectors 160 can be formed from a metal such as copper, tungsten, titanium, aluminum, gold, silver, tin, nickel, lead, or a combination of metals/alloys, or may be formed of other electrically conductive material or combination of electrically conductive materials. In some cases, the one or more buried power connectors 160 can be coupled to the one or more second power posts 155 at an interface between the PDN 140 and the first substrate 105 as shown by the buried power connector 160*a*, at an interface between the one or more passive or active devices 110 and the second power posts 155 as shown by buried power connector 160*b*, and/or at an interface between the second power posts 155 and an interconnect 162 (e.g., via) of the first substrate 105 as shown by buried power connector 160*c*. In some cases, the one or more buried power connectors 160 can be directly coupled to the one or more passive or active devices 110 as shown by buried power connector 160*d*. In some cases, a width of the buried power connectors 160 is between about 0.02 μm to about 2 μm while a height of the buried power connectors 160 is between about 0.1 μm to about 10 μm.

Figure 3:
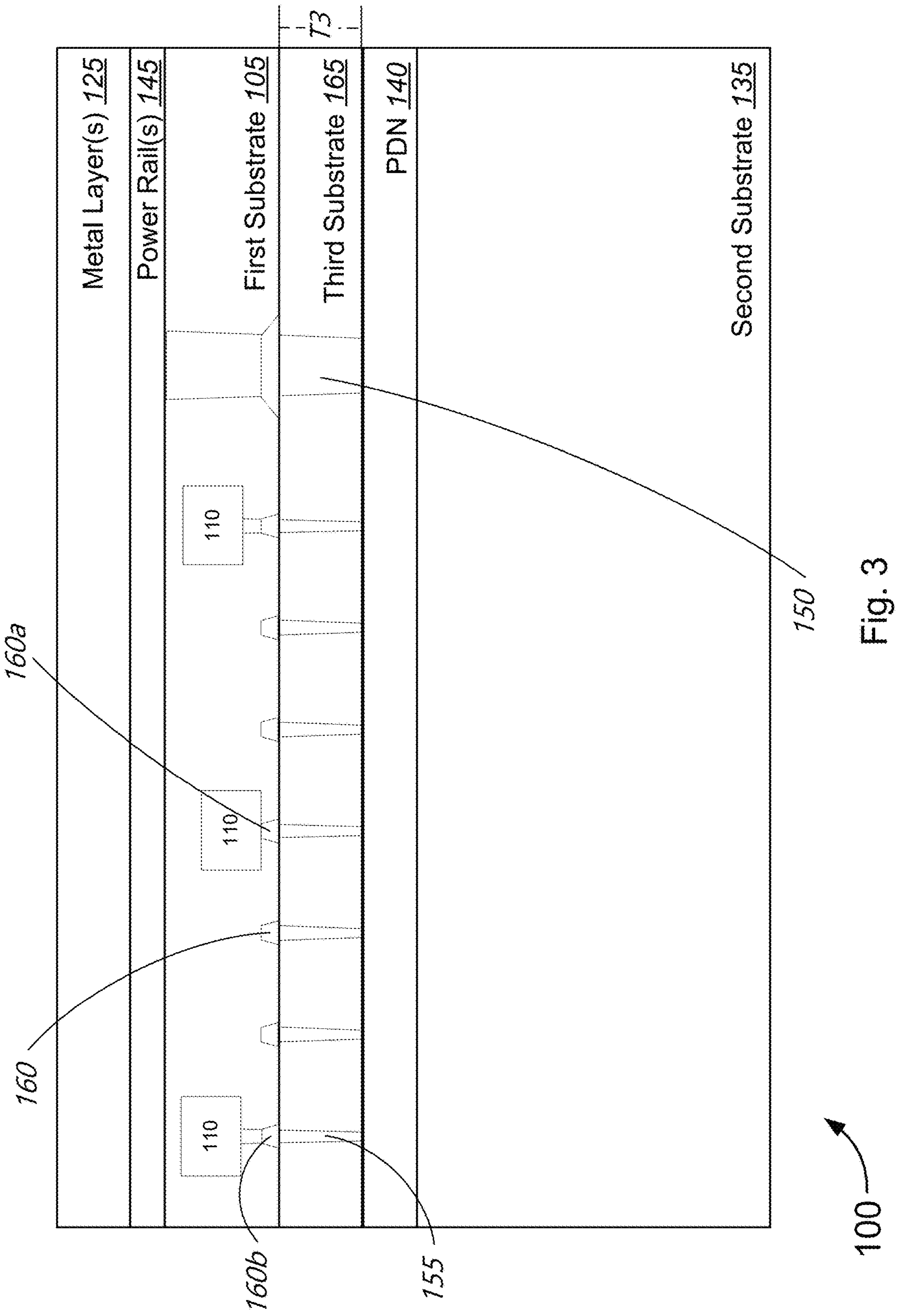
FIG. 3 is a schematic cross-sectional view of a semiconductor device with a backside power distribution network, in accordance with various embodiments.

In another embodiment, as shown in FIG. 3, the one or more GPPs 150 and/or second power posts 155 can be integrated within a third substrate or layer 165. The third substrate 165 can be an interposer substrate or layer (e.g., a substrate or layer configured to provide one or more connections or interconnections (e.g., electrical connections, or the like) between the PDN 140 and the first substrate 105 and/or one or more passive or active devices 110 of the first substrate 105.

The third substrate 165 can be formed from monocrystalline silicon, polycrystalline silicon, an organic material, a glass material, a ceramic material, and/or others. In some cases, the third substrate 165 can be formed from polycrystalline silicon. In various cases, the third substrate 165 can be formed from one or more layers. The one or more layers can include, without limitation, one or more dielectric layers, one or more device layers, one or more conducting layers, one or more insulating layers, one or more redistribution layers, and/or the like.

In some cases, the PDN 140 is at an interface between the third substrate 165 and the second substrate 135. The PDN 140 can directly contact the third substrate 165 and/or the second substrate 135. In various instances, the PDN 140 can be fabricated with the second substrate 135 or with the third substrate 165.

In various cases, a first thickness T1 of the first substrate 105 can be about 1.5 μm to about 50 μm, a second thickness T2 of the second substrate 135 can be about 100 μm to about 800 μm, and a third thickness T3 of the third substrate 165 can be about 10 μm to about 50 μm. Preferably, a ratio of a first thickness T1 of the first substrate 105 to a third thickness T3 of the third substrate 165 is between about 1:20 and 1:5. Preferably, a ratio of a second thickness T2 of the second substrate 135 to a third thickness T3 of the third substrate 165 is between about 80:1 and 10:1.

When the one or more GPPs 150 and/or one or more second power posts 155 are integrated within the third substrate 165, one or more buried power connectors 160 can be exposed on the first substrate 105 to bond with the one or more GPPs 150 and/or one or more second power posts 155 of the third substrate 165. In some cases, the one or more buried power connectors 160 directly couple to one or more passive or active devices 110 as shown by buried power connector 160*a*. Alternatively, in other cases, the one or more buried power connectors 160 indirectly couple to one or more passive or active devices 110 as shown by buried power connector 160*b*.

Figure 4:
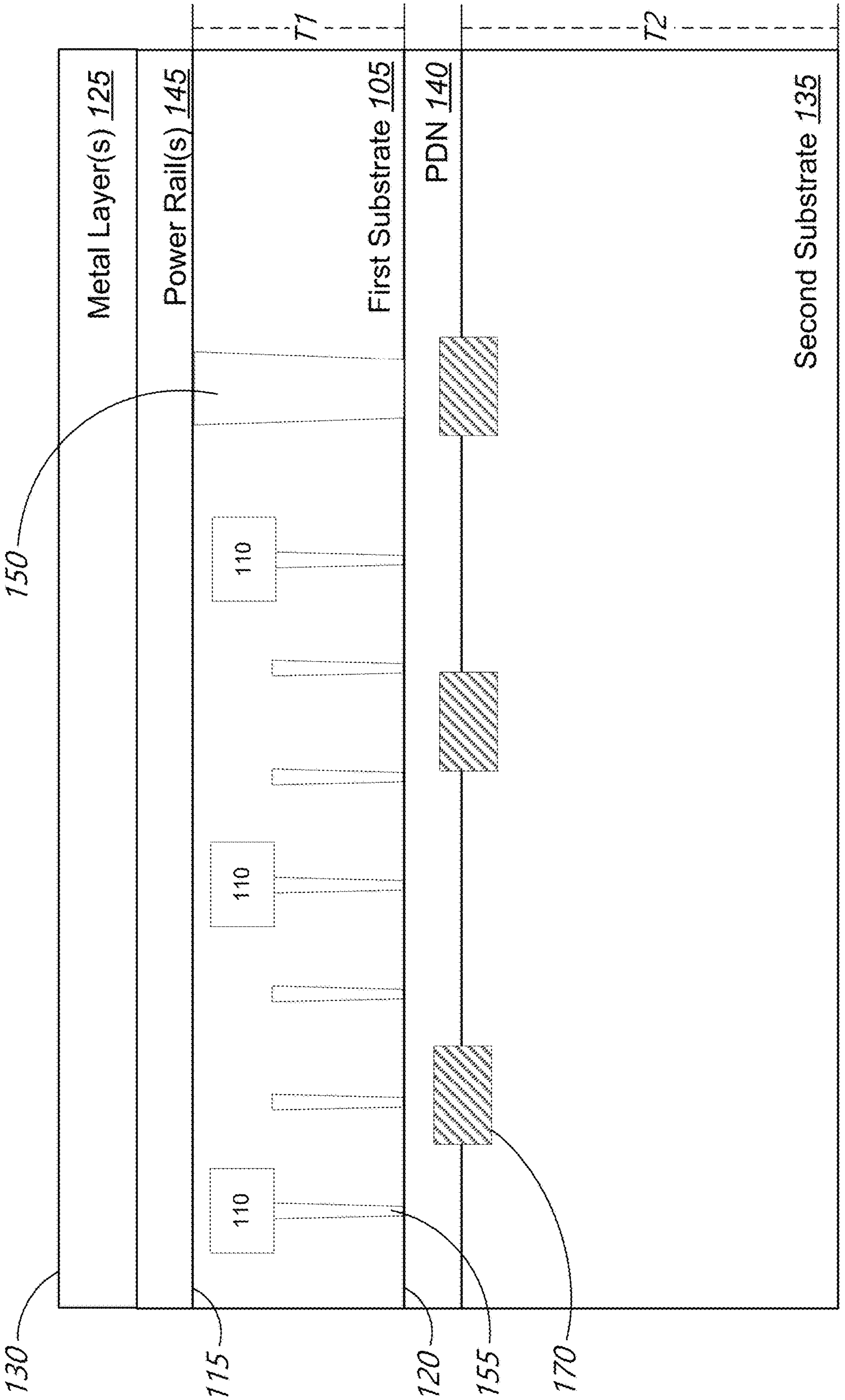
FIG. 4 is a schematic cross-sectional view of a semiconductor device with a backside power distribution network, in accordance with various embodiments.
Figure 5:
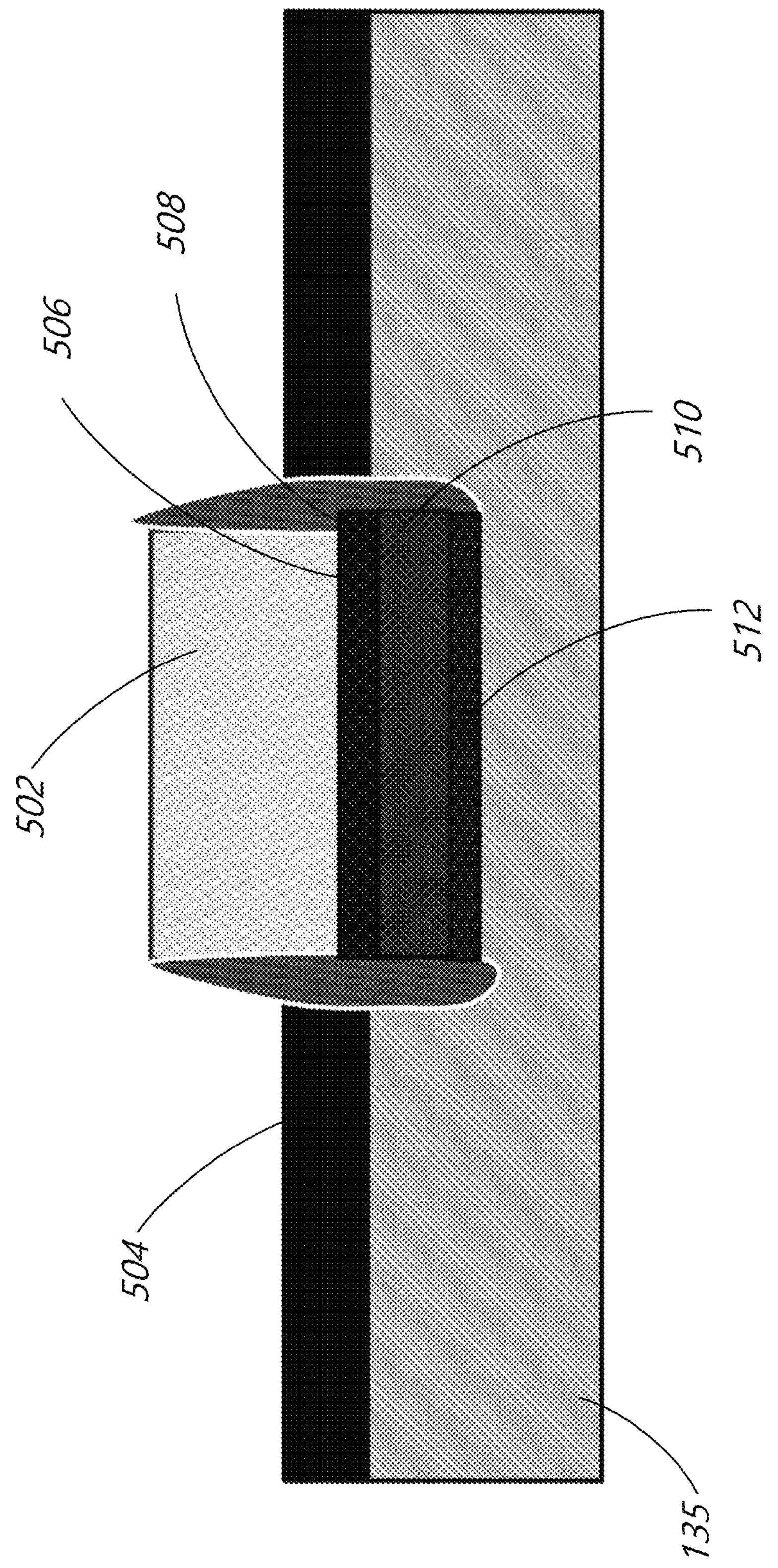
FIG. 5 is a schematic cross-sectional view of a memory device, in accordance with various embodiments

In some cases, one or more active or passive devices 170 can be integrated into the second substrate 135, as shown in FIG. 4. The one or more active or passive devices 170 can include, without limitation, non-volatile memory such as flash memory. For example, a flash memory 500, as shown in FIG. 5, can be formed using the second substrate 135 when the second substrate 135 is formed from polycrystalline silicon. The flash memory 500 can include a metal gate 502 configured to be coupled to the PDN 140, a source and/or drain region 504, and a gate stack 506. The gate stack 506 can be disposed within the polycrystalline silicon of the second substrate 135 and formed from a first silicon dioxide layer 508, a silicon nitride layer 510, and a second silicon dioxide layer 512.

Figure 6:
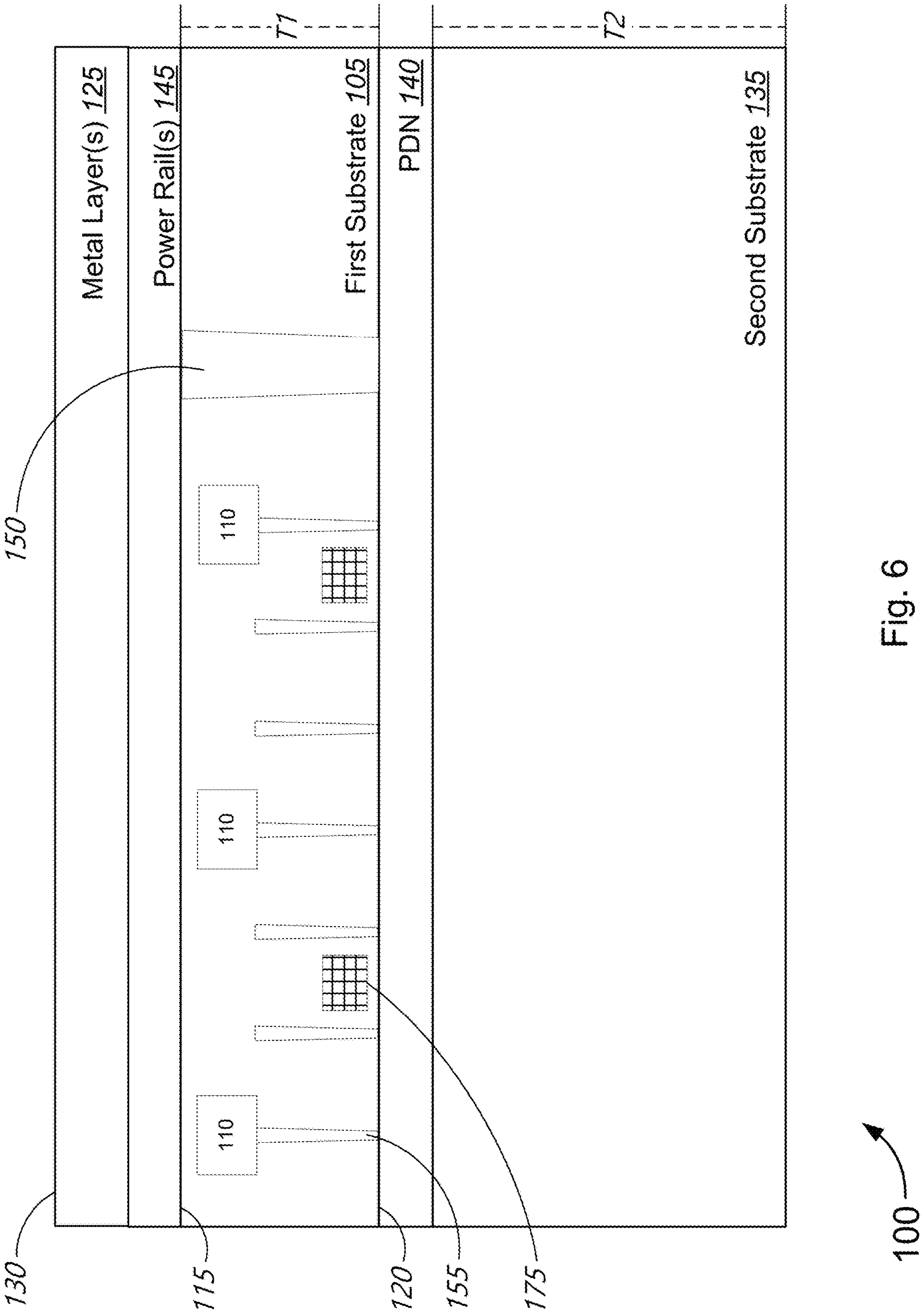
FIG. 6 is a schematic cross-sectional view of a semiconductor device with a backside power distribution network, in accordance with various embodiments.

In some embodiments, as shown in FIG. 6, the back side of the first substrate 105 can be used to form one or more current control circuits 175 on the second side 120 or towards the second side 120 of the first substrate 105. The one or more current control circuits 175 can control a voltage as it is transmitted through the PDN 140, the GPPs 150, the second power posts 155, and/or the like. In some cases, interconnection layers on the first side 115 of the first substrate 105 can be formed using 16 nm, 7 nm, 5 nm or lower node fabrication or lithography processes while interconnection layers on the second side 120 of the first substrate 105 can be formed using 40 nm, 130 nm, 180 nm or higher node fabrication or lithography processes. The one or more current control circuits 175 can be formed using 40 nm, 130 nm, 180 nm or higher node fabrication or lithography processes.

Figure 7:
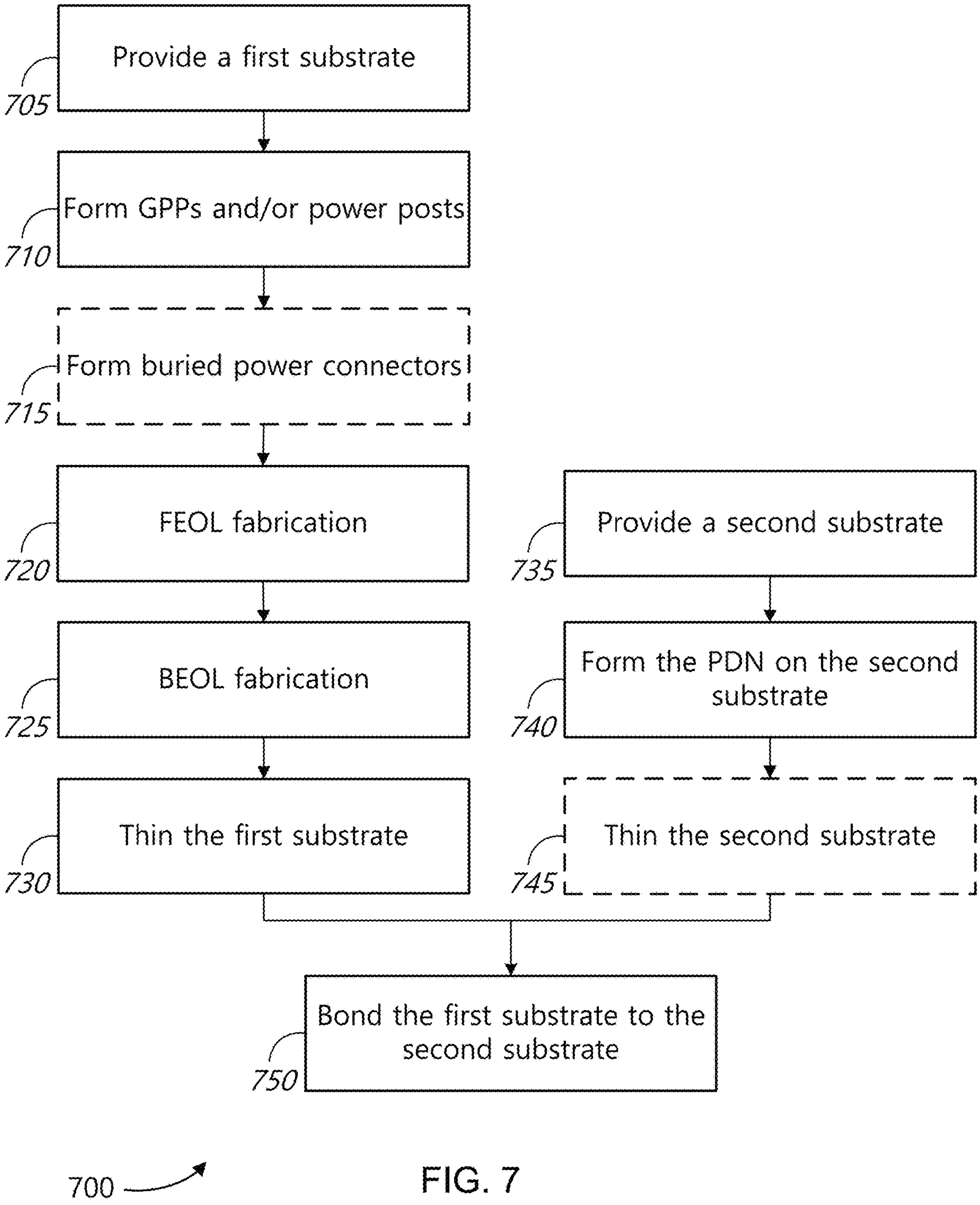
FIG. 7 is a flow diagram of a method of fabricating a semiconductor device with a backside power distribution network, in accordance with various embodiments.
Figure 8:
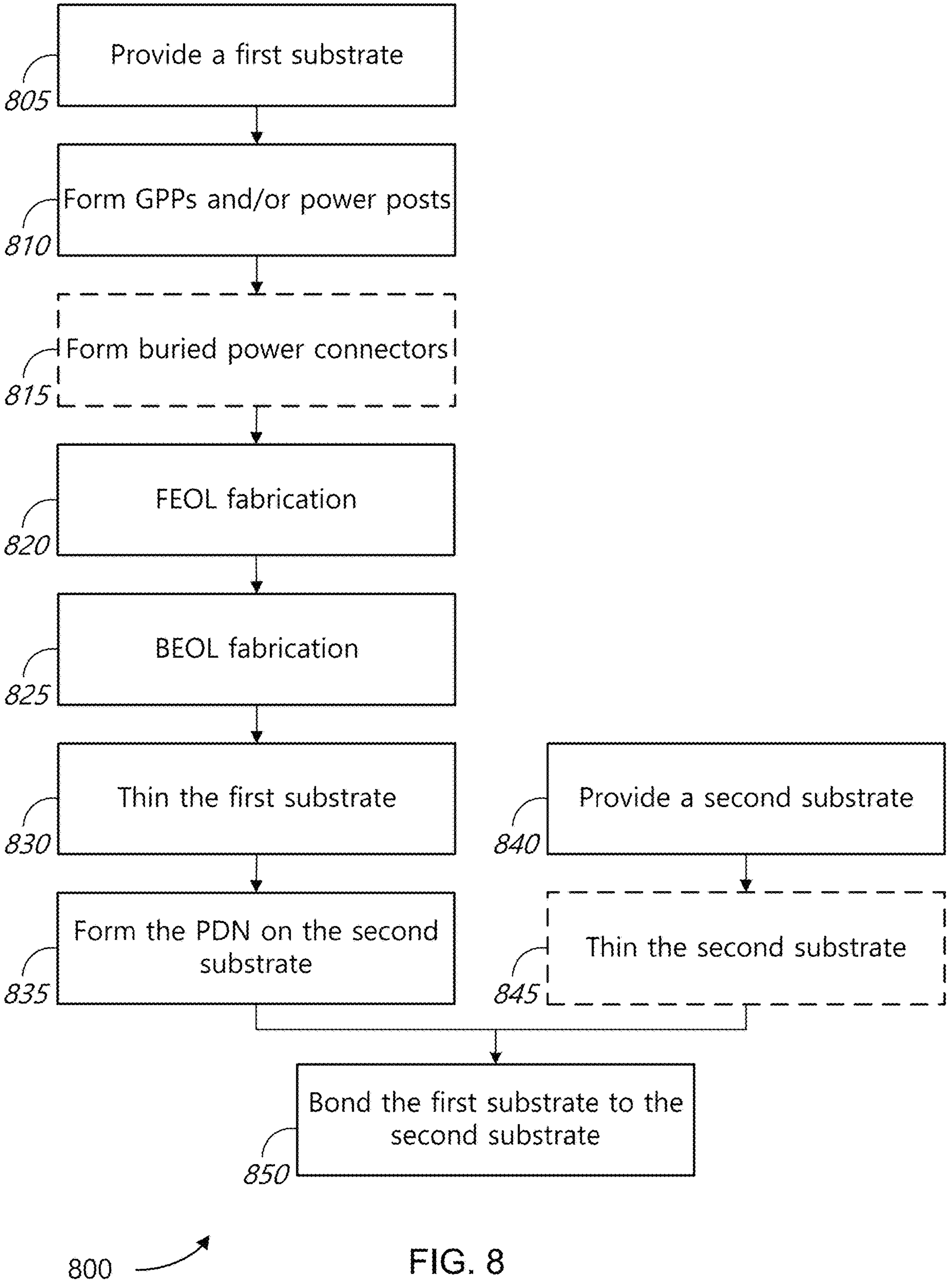
FIG. 8 is a flow diagram of a method of fabricating a semiconductor device with a backside power distribution network, in accordance with various embodiments.
Figure 9:
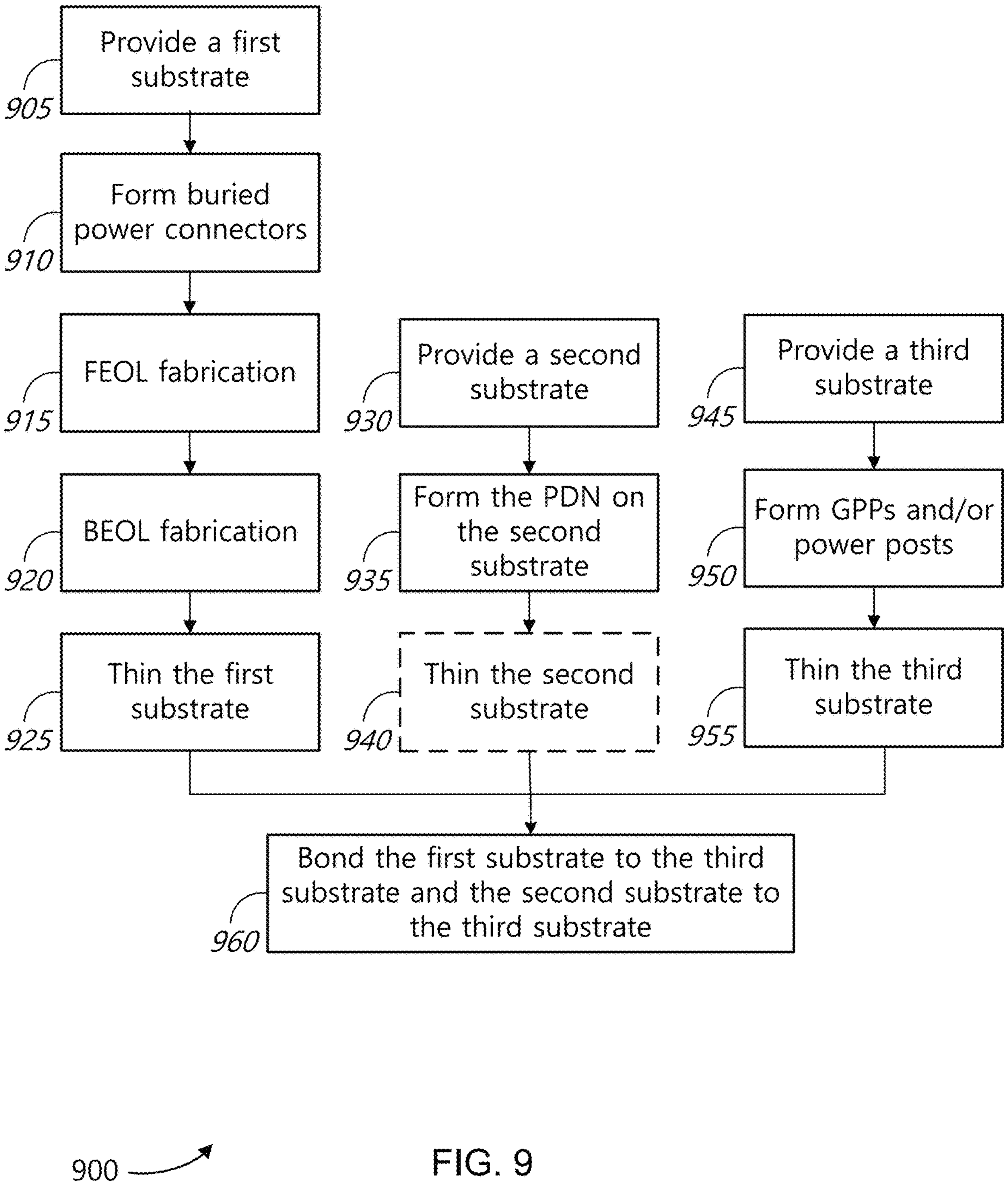
FIG. 9 is a flow diagram of a method of fabricating a semiconductor device with a backside power distribution network, in accordance with various embodiments.
Figure 10:
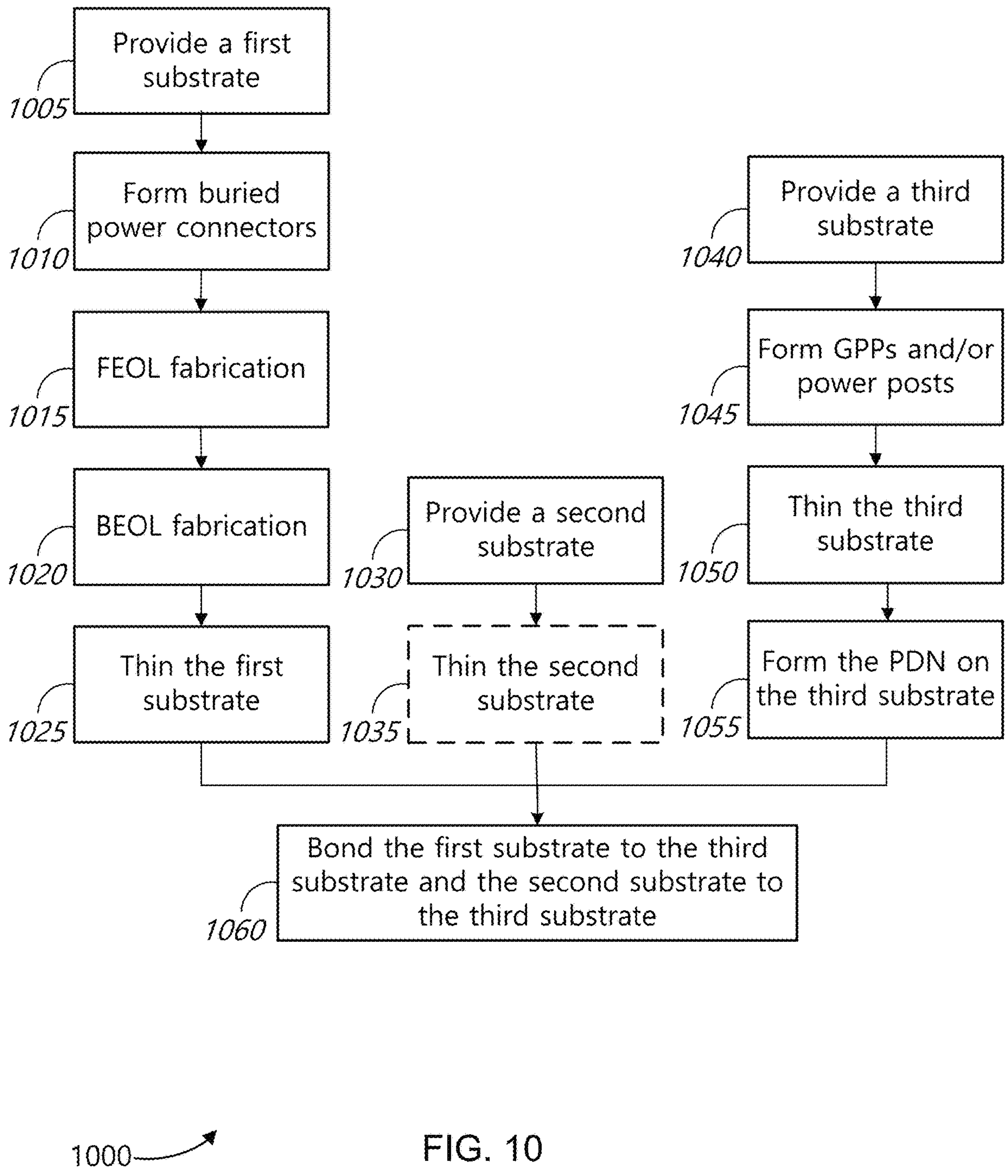
FIG. 10 is a flow diagram of a method of fabricating a semiconductor device with a backside power distribution network, in accordance with various embodiments.

FIGS. 7-10 are flow diagrams of a method of manufacturing a semiconductor device 100, in accordance with various embodiments. FIG. 7 is a flow diagram of a method of manufacturing a semiconductor device 100 having a PDN 140 formed on the second side of the first substrate 105. FIG. 8 is a flow diagram of a method of manufacturing a semiconductor device 100 having a PDN 140 formed on the second substrate 135. FIG. 9 is a flow diagram of a method of manufacturing a semiconductor device 100 having a PDN 140 formed on the second substrate 135 and GPPs and/or one or more power posts formed in a third substrate 165. FIG. 10 is a flow diagram of a method of manufacturing a semiconductor device 100 having a PDN 140 formed on the third substrate 165.

Turning to FIG. 7, the method 700 may begin, at block 705, by providing or forming a first substrate (e.g., first substrate 105, or the like). Forming the first substrate may include, without limitation, various additive and/or subtractive manufacturing processes, as known to those skilled in the art. In further examples, manufacturing techniques that are being developed and/or yet to be developed may be utilized to form the substrate. Thus, it is to be understood that the method 700 is not limited to any particular method of manufacturing the first substrate.

In some cases, forming the first substrate can include forming at block 710 one or more GPPs (e.g., GPPs 150, or the like) and/or one or more power posts (e.g., second power posts 155, or the like) in a backside of the first substrate. In a non-limiting example, the one or more GPPs and/or one or more power posts can be formed by drilling one or more openings in the backside of the first substrate and filling the one or more openings with a conductive material (e.g., copper, tungsten, or other conductive material).

Next, one or more buried power connectors (e.g., buried power connectors 160) can be optionally formed in the first substrate at optional block 715. In a non-limiting example, the one or more buried power connectors can be formed by drilling one or more openings in the back side of the first substrate and filling the one or more openings with a conductive material (e.g., copper, tungsten, or other conductive material). In some cases, the one or more buried power connectors can be coupled to the one or more GPPs, one or more power posts, and/or one or more passive or active devices (e.g., passive or active devices 110).

Next, the first substrate 105, at block 720, can be fabricated or treated with one or more front end of line (FEOL) processes. FEOL processes are a first portion of semiconductor device fabrication where one or more passive or active devices (e.g., passive or active devices 110) are patterned in the first substrate. FEOL generally covers everything up to (but not including) the deposition of metal interconnect layers (e.g., metal layers 125, or the like). FEOL process can include, but are not limited to, trench isolation, well formation, gate formation, source and drain formation, and/or the like.

In some embodiments, once the first substrate is treated with one or more FEOL processes, then, at block 725, one or more back end of line (BEOL) fabrication processes can occur. The one or more BEOL processes are the second portion of semiconductor device fabrication where the one or more passive or active devices are interconnected with wiring. BEOL generally begins when the first layer of metal (e.g., metal layer 125) is deposited on the first substrate. BEOL includes, without limitation, the formation of contacts, insulating layers (dielectrics), metal levels, vias, and bonding sites for chip-to-package connections, and/or the like.

In some cases, one or more current control circuits (e.g., current control circuits 175, or the like) can be formed on a back side of the first substrate. In some cases, the first side of the first substrate can be formed using 16 nm, 7 nm, 5 nm or lower node fabrication or lithography processes while the second side 120 of the first substrate 105 can be formed using 40 nm, 130 nm, 180 nm or higher node fabrication or lithography processes. The one or more current control circuits can be formed using 40 nm, 130 nm, 180 nm or higher node fabrication or lithography processes.

The method 700 continues, at block 730, by thinning the first substrate 105 to expose the one or more GPPs and/or one or more power posts and/or to expose the one or more buried power connectors to couple to the PDN.

Next, formation of the second substrate can occur. In some cases, the second substrate can be formed in parallel with (e.g., at the same time as) the first substrate. In some cases, the second substrate can be formed at a different location or at a different time than the first substrate. The method 700, might include, at block 735 providing or forming a second substrate. Forming the second substrate may include, without limitation, various additive and/or subtractive manufacturing processes, as known to those skilled in the art. In further examples, manufacturing techniques that are being developed and/or yet to be developed may be utilized to form the substrate. Thus, it is to be understood that the method 700 is not limited to any particular method of manufacturing the second substrate.

In some cases, before the PDN is fabricated on the second substrate, one or more active or passive devices (e.g., active or passive devices 170) can be formed in the second substrate. For example, the one or more active or passive devices can include memory devices (e.g., flash memory). By fabricating one or more active or passive devices within the second substrate, the second substrate can be used and make room for other active or passive devices on the first substrate.

In some cases, forming the second substrate can include forming, at block 740, the PDN (e.g., PDN 140, or the like) on the second substrate. By forming the PDN on the second substrate, the first substrate comprising the one or more active and passive devices does not need to go through as many fabrication steps which reduces the chances of the first substrate being damaged or broken.

Next, the second substrate can be optionally thinned at optional block 745.

Finally, once the first substrate and the second substrate are fabricated, the first substrate and the second substrate can be bonded together, at step 750, using a wafer or substrate bonding technique with the PDN at an interface between the first substrate and the second substrate. The PDN can be coupled to a back side of the first substrate and coupled to the one or more GPPs, one or more power posts, and/or one or more buried power connectors of the first substrate. The one or more wafer or substrate bonding techniques can include, without limitation, direct bonding, surface activated bonding, plasma activated bonding, anodic bonding, eutectic bonding, glass frit bonding, adhesive bonding, thermocompression bonding, reactive bonding, transient liquid phase diffusion bonding, atomic diffusion bonding, and/or the like.

Turning to FIG. 8, the method 800 may begin, at block 805, by providing or forming a first substrate. This step can be similar to step 705 of FIG. 7. In some cases, forming the first substrate can include forming, at block 810, one or more GPPs and/or one or more power posts in a backside of the first substrate. This step can be similar to step 710 of FIG. 7. Next, at optional block 815, one or more buried power connectors can be formed in the first substrate similar to optional block 715 of FIG. 7. The first substrate, at block 820, can be fabricated with one or more FEOL processes. This step can be similar to step 720 of FIG. 7. In some embodiments, once the first substrate is fabricated with one or more FEOL processes, then, at block 825, one or more BEOL processes can occur. This step can be similar to step 725 of FIG. 7. The method 800 continues, at block 830, by thinning the first substrate to expose the one or more GPPs, one or more power posts, and/or one or more buried power connectors. This step can be similar to step 730 of FIG. 7.

Method 800, at block 835, can include forming or fabricating the PDN on a back side of the first substrate and coupling the PDN to the one or more GPPs, one or more power posts, and/or one or more buried power connectors of the first substrate.

Next, formation of the second substrate can occur. In some cases, the second substrate can be formed in parallel with the first substrate. In some cases, the second substrate can be formed at a different location or time than the first substrate. The method 800, might include, at block 840 providing or forming a second substrate. This step can be similar to step 735 of FIG. 7. Next, the second substrate can be optionally thinned at step 845 (similar to step 745 of FIG. 7).

Finally, once the first substrate and the second substrate are formed, the first substrate and the second substrate can be bonded together using a wafer or substrate bonding technique with the PDN at an interface between the first substrate and the second substrate. This step can be similar to step 750 of FIG. 7.

Turning to FIG. 9, the method 900 may begin, at block 905, by providing or forming a first substrate. This step can be similar to step 705 of FIG. 7 or 805 of FIG. 8. In some cases, forming the first substrate can include forming, at block 910, one or more one or more buried power connectors similar to optional block 715 of FIG. 7 or optional block 815 of FIG. 8. The first substrate, at block 915, can then be fabricated with one or more FEOL processes. This step can be similar to step 720 of FIG. 7 or step 820 of FIG. 8. In some embodiments, once the first substrate is fabricated with one or more FEOL processes, then, at block 920, one or more BEOL processes can occur. This step can be similar to step 725 of FIG. 7 or step 825 of FIG. 8. The method 900 continues, at block 925, by thinning the first substrate to expose the one or more buried power connectors. This step can be similar to step 730 of FIG. 7 or step 830 of FIG. 8.

Next, formation of the second substrate can occur. In some cases, the second substrate can be formed in parallel with the first substrate. In some cases, the second substrate can be formed at a different location or time than the first substrate. The method 900, might include, at block 930 providing or forming a second substrate. This step can be similar to step 735 of FIG. 7 or step 840 of FIG. 8. In some cases, forming the second substrate can include forming, at block 935, the PDN on the second substrate. This step can be similar to step 740 of FIG. 7). Next, the second substrate can be optionally thinned at step 940 (similar to step 745 of FIG. 7 or step 845 of FIG. 8).

In some cases, formation of a third substrate (e.g., third substrate 165, or the like) can occur. In some cases, the third substrate can be formed in parallel with the first substrate and/or the second substrate. In some cases, the second substrate can be formed at a different location or time than the first substrate and/or second substrate. The method 900, might include, at block 945 providing or forming a third substrate. Forming the third substrate may include, without limitation, various additive and/or subtractive manufacturing processes, as known to those skilled in the art. In further examples, manufacturing techniques that are being developed and/or yet to be developed may be utilized to form the third substrate. Thus, it is to be understood that the method 900 is not limited to any particular method of manufacturing the third substrate.

In some cases, forming the third substrate can include forming at block 940 one or more GPPs (e.g., GPPs 150, or the like) and/or one or more power posts (e.g., second power posts 155, or the like) extending through the third substrate. In a non-limiting example, the one or more GPPs and/or one or more power posts can be formed by drilling one or more openings in the third substrate and filling the one or more openings with a conductive material (e.g., copper, tungsten, or other conductive material). Next, the third substrate can be thinned at step 945 to expose the one or more GPPs and/or power posts.

Finally, once the first substrate, the second substrate, and the third substrate are formed, the first substrate and the third substrate can be bonded together using a wafer or substrate bonding technique and the second substrate and the third substrate can be bonded together using a wafer or substrate bonding technique at step 960. When the first substrate, third substrate, and second substrate are bonded together, the PDN is at an interface between the second substrate and the third substrate and coupled to the one or more GPPs and/or power posts.

Turning to FIG. 10, the method 1000 may begin, at block 1005, by providing or forming a first substrate. This step can be similar to step 705 of FIG. 7, step 805 of FIG. 8, or step 905 of FIG. 9. In some cases, forming the first substrate can include forming, at block 1010, one or more one or more buried power connectors similar to optional block 715 of FIG. 7, optional block 815 of FIG. 8, or block 910 of FIG. 9. The first substrate, at block 1015, can then be fabricated with one or more FEOL processes. This step can be similar to step 720 of FIG. 7, step 820 of FIG. 8, or step 915 of FIG. 9. In some embodiments, once the first substrate is fabricated with one or more FEOL processes, then, at block 1020, one or more BEOL processes can occur. This step can be similar to step 725 of FIG. 7, step 825 of FIG. 8, or step 920 of FIG. 9. The method 1000 continues, at block 1025, by thinning the first substrate to expose the one or more buried power connectors. This step can be similar to step 730 of FIG. 7, step 830 of FIG. 8, or step 1025 of FIG. 9.

Next, formation of the second substrate can occur. In some cases, the second substrate can be formed in parallel with the first substrate. In some cases, the second substrate can be formed at a different location or time than the first substrate. The method 1000, might include, at block 1030 providing or forming a second substrate. This step can be similar to step 735 of FIG. 7, step 840 of FIG. 8, or step 930 of FIG. 9. Next, the second substrate can be optionally thinned at step 1035 (similar to step 745 of FIG. 7, step 845 of FIG. 8, or step 1040 of FIG. 9).

Additionally, formation of a third substrate can occur. In some cases, the third substrate can be formed in parallel with the first substrate and/or the second substrate. In some cases, the second substrate can be formed at a different location or time than the first substrate and/or second substrate. The method 1000, might include, at block 1040 providing or forming a third substrate (similar to step 945 of FIG. 9). In some cases, forming the third substrate can include forming at block 1045 one or more GPPs and/or one or more power posts extending through the third substrate (similar to block 950 of FIG. 9). Next, the third substrate can be thinned at step 1050 to expose the one or more GPPs and/or power posts (similar to step 1055 of FIG. 9). Additionally, the method 1000 can further include forming, at block 1055, the PDN on the third substrate. The PDN can be coupled to the one or more GPPs and/or power posts of the third substrate.

Finally, once the first substrate, the second substrate, and the third substrate are formed, the first substrate and the third substrate can be bonded together using a wafer or substrate bonding technique and the second substrate and the third substrate can be bonded together using a wafer or substrate bonding technique at step 1060. When the first substrate, third substrate, and second substrate are bonded together, the PDN is at an interface between the second substrate and the third substrate.

The techniques and processes described above with respect to various embodiments may be used to manufacture the semiconductor devices 100 of FIGS. 1-6, and/or components thereof, as described herein.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:

a first substrate comprising a first device configured to receive a voltage, a first side disposed on a front of the first substrate, and a second side disposed on a back of the first substrate, wherein the first substrate further comprises a circuit towards the second side of the first substrate, wherein the circuit is configured to control a current;

a second substrate, the second substrate configured to support the first substrate; and a power distribution network disposed at an interface between the second side of the first substrate and the second substrate.

2. The apparatus of claim 1, wherein the first substrate comprises monocrystalline silicon and the second substrate comprises monocrystalline silicon, polycrystalline silicon, silicon carbide, glass, sapphire, or gallium arsenide.

3. The apparatus of claim 1, wherein the first device configured to receive the voltage comprises a transistor.

4. The apparatus of claim 1, wherein the power distribution network directly couples to the second side of the first substrate and the second substrate.

5. The apparatus of claim 1, wherein a ratio of a first thickness of the first substrate to a second thickness of the second substrate is between about 1:200 and 1:10.

6. The apparatus of claim 1, wherein the second substrate further comprises a second device configured to provide non-volatile memory.

7. The apparatus of claim 1, further comprising:

a third substrate between the power distribution network and the first substrate; and the third substrate couples the power distribution network to the first substrate.

8. The apparatus of claim 7, wherein the third substrate further comprises:

a first connector coupled to a power source and to the power distribution network; and a second connector coupled to the power distribution network and the first device of the first substrate.

9. The apparatus of claim 1, wherein the first substrate further comprises:

a first connector coupled to a power source and to the power distribution network; and a second connector coupled to the power distribution network and the first device of the first substrate.

10. The apparatus of claim 9, wherein a ratio of a first diameter of the first connector to a second diameter of the second connector is between about 3:1 and 20:1.

11. The apparatus of claim 9, wherein at least one of the first connector or the second connector comprises a via or a trench.

12. A method of manufacturing a backside power distribution network of a semiconductor device, the method comprising:

forming at least one of a first substrate or a second substrate, wherein the first substrate comprises a device configured to receive a voltage and a circuit towards a back side of the first substrate, wherein the circuit is configured to control a current, and wherein the second substrate is configured to support the first substrate; and forming a power distribution network configured to be disposed at an interface between the back side of the first substrate and the second substrate.

13. The method of claim 12, wherein forming the power distribution network disposed at the interface between the first substrate and the second substrate comprises forming the power distribution network on the back side of the first substrate.

14. The method of claim 13, wherein, once the power distribution network is formed on the first substrate, the method further comprises bonding the first substrate to the second substrate.

15. The method of claim 12, wherein forming the power distribution network disposed at the interface between the first substrate and the second substrate comprises forming the power distribution network on the second substrate.

16. The method of claim 15, wherein, once the power distribution network is formed on the second substrate, the method further comprises bonding the first substrate to the second substrate.

17. The method of claim 12, wherein forming the power distribution network disposed at the interface between the first substrate and the second substrate comprises forming a third substrate and forming the power distribution network on the third substrate, wherein the third substrate further comprises a connector configured to couple the device of the first substrate with the power distribution network.

18. The method of claim 17, wherein, once the power distribution network is formed on the third substrate, the method further comprises bonding the first substrate to the third substrate and the second substrate to the third substrate, wherein the power distribution network is between the second substrate and the third substrate.

19. A semiconductor device comprising:

a first substrate comprising a device configured to receive a voltage;

a metal layer coupled to a first side of the first substrate;

a second substrate coupled to a second side of the first substrate opposite the metal layer and the first side, the second substrate configured to support the first substrate; and a power distribution network disposed between the second side of the first substrate and the second substrate, wherein the first substrate further comprises a circuit towards the second side of the first substrate, wherein the circuit is configured to control a current.

* * * * *